(12) United States Patent
Brar et al.

(10) Patent No.: US 6,605,825 B1
(45) Date of Patent: Aug. 12, 2003

(54) BIPOLAR TRANSISTOR CHARACTERIZATION APPARATUS WITH LATERAL TEST PROBE PADS

(75) Inventors: Berinder P. S. Brar, Newbury Park, CA (US); James Chingwei Li, Thousand Oaks, CA (US); John A. Higgins, Westlake Village, CA (US)

(73) Assignee: Innovative Technology Licensing, LLC, Thousand Oaks, CA (US)

( * ) Notice: Subject to any disclaimer, the term of this patent is extended or adjusted under 35 U.S.C. 154(b) by 0 days.

(21) Appl. No.: 10/075,758

(22) Filed: Feb. 14, 2002

(51) Int. Cl.[7] .............................................. H01L 23/58

(52) U.S. Cl. ........................................ 257/48; 257/565

(58) Field of Search .......................... 257/48, 565, 577, 257/578, 586, 587, 589, 590, 566, 567, 568, 69, 350

(56) References Cited

U.S. PATENT DOCUMENTS 4,079,505 A * 3/1978 Hirano et al. .................. 29/574

\* cited by examiner

Primary Examiner—Wael Fahmy
Assistant Examiner—Dana Farahani
(74) Attorney, Agent, or Firm—Koppel, Jacobs, Patrick & Heybl

(57) ABSTRACT

Test probe pads are located lateral to, and spaced from, the emitter, base or collector region of a bipolar transistor, preferably on separate pedestals, and connected to their respective transistor regions by air bridges. The probe pads, transistor contacts and air bridges are preferably formed as common metallizations. In the case of an HBT, a gap in the subcollector below the air bridges insulates the test transistor from capacitor loading by the probe pads. The test transistors can be used to characterize both themselves and functional circuit transistors fabricated with the same process on the same wafer by testing at an intermediate stage of manufacture, thus allowing wafers to be discarded without completing the manufacture if their transistors do not meet specifications.

22 Claims, 4 Drawing Sheets

BIPOLAR TRANSISTOR CHARACTERIZATION APPARATUS WITH LATERAL TEST PROBE PADS

BACKGROUND OF THE INVENTION

1. Field of the Invention

This invention relates to the characterization of bipolar transistors, and more particularly to a novel heterojunction bipolar transistor (HBT) test structure and method in which test probe pads are provided lateral to respective transistor regions prior to forming an upper metallization.

2. Description of the Related Art

In characterizing newly manufactured bipolar transistors to determine whether they operate properly and meet specifications, a small portion of the transistors on a wafer (typically less than one percent) are dedicated as test devices. Since all of the transistors on the wafer are fabricated in a common process, they will generally exhibit common operating characteristics. Therefore, characterizing the relatively few test transistors can be taken as a characterization of the larger number of circuit transistors that are employed in the operating circuitry of the wafer.

When the transistor fabrication has been completed, the wafer is coated with one or more dielectric layers, with metallized leads formed on each layer and extending through the underlying dielectric to establish electrical connections with the transistors. The metallization for the test transistors is provided with enlarged probe pads on the upper dielectric surface so that the test transistors can be electrically accessed via test probes brought into contact with the contact pads. (The term "metallization" as used herein is not limited to conventional metal elements, but also encompasses alternate conductive mechanisms such as heavily doped semiconductor.)

While this approach has been found to be effective in characterizing a large number of transistors by actually testing only a small portion, it requires that the wafer fabrication be fully completed before characterization can take place. Thus, if the test transistors do not meet specifications, the completed wafer must be discarded. This is costly in terms of both processing time and expense.

SUMMARY OF THE INVENTION

The present invention seeks to provide a novel test transistor structure and associated characterization method that allows transistor characterization to be completed before the wafer has been fully fabricated, and in particular before the upper metallization is laid down. The invention is particularly applicable to HBTs, and permits bad wafers to be identified and discarded without incurring the cost and time necessary to fabricate the upper metallization.

These goals are achieved according to one embodiment of the invention by providing test probe pads, of sufficient size to receive test probes, lateral to, spaced from and substantially coplanar with one or more of the test transistor emitter, base and collector regions. The probe pads are fabricated prior to forming the upper metallization, and are preferably disposed on pedestals and connected to their associated transistor regions by air bridges. For an HBT, air bridge connections are preferably made to the emitter and base from probe pads on respective pedestals lateral to and spaced from the transistor, while a collector contact is made via the subcollector, either by an air bridge to a probe contact on a separate pedestal, or by a lead which extends along the substrate to a separate probe pad. A gap is preferably provided in the subcollector below the air bridges to reduce capacitive coupling. The test probe pads, air bridges and their respective transistor regions are preferably formed in respective simultaneous common metallizations.

Once the transistors have been fabricated, but prior to forming the upper metallization, the test transistors are accessed and characterized via their respective probe pads. If the transistors do not meet specifications, the wafer can be discarded in its partially completed state. The upper metallization is fabricated only if the test transistors meet specifications, thus characterizing the circuit transistors as operating properly. Connections to the circuit transistors are then made through the dielectric underlying the upper metallization, while the test transistors need not be accessed again.

These and further features and advantages of the invention will be apparent to those skilled in the art from the following detailed description, taken together with the accompanying drawings, in which:

DETAILED DESCRIPTION OF THE INVENTION

Figure 1:
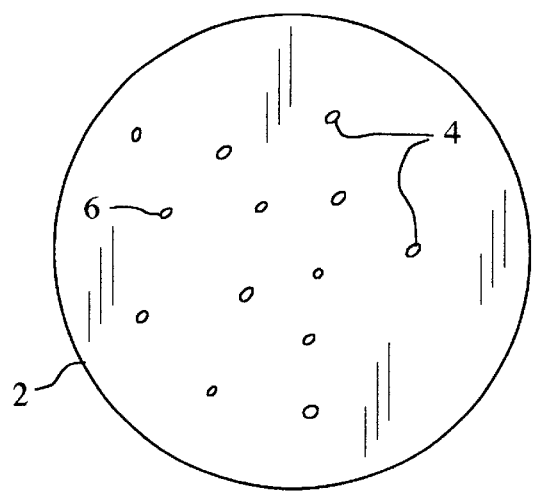
FIG. 1 is a simplified plan view of a semiconductor wafer bearing both circuit and test transistors.

FIG. 1 illustrates in very simplified form a semiconductor wafer 2 that bears an array of bipolar transistors. Some of the transistors are test devices 4 which are provided only for purposes of characterizing all of the transistors on the wafer, and are not included in the functional operation of the wafer's circuitry. The remaining transistors, illustrated by reference number 6, are referred to herein as circuit transistors because they play an active role in the operation of the wafer's circuitry. The test transistors are much fewer in number than the circuit transistors, and are scattered around the wafer so that possible variations in transistor quality at different locations of the wafer can be detected. The transistors can be organized into an overall wafer-sized circuit, or the wafer can be diced into separate IC chips with their own respective circuits in which case the test transistors would normally be provided between chip areas. Lead wires and other circuit elements are not included in FIG. 1 for purposes of simplification.

Since all of the wafer transistors are formed in a common fabrication process, each of them should have similar operating characteristics. Therefore, in practice it has been found that test characterization of only a few test transistors can be used to effectively characterize all of the transistors of similar type on the wafer.

The characterization approach using a small number of test transistors described thus far is conventional. However, the invention provides a novel structure for the test transistors and their associated test probe pads that allows all of the transistors on the wafer to be characterized before the wafer fabrication has been completed, thus eliminating the need for a portion of the normal fabrication process if the transistors do not meet specifications.

Figure 2:
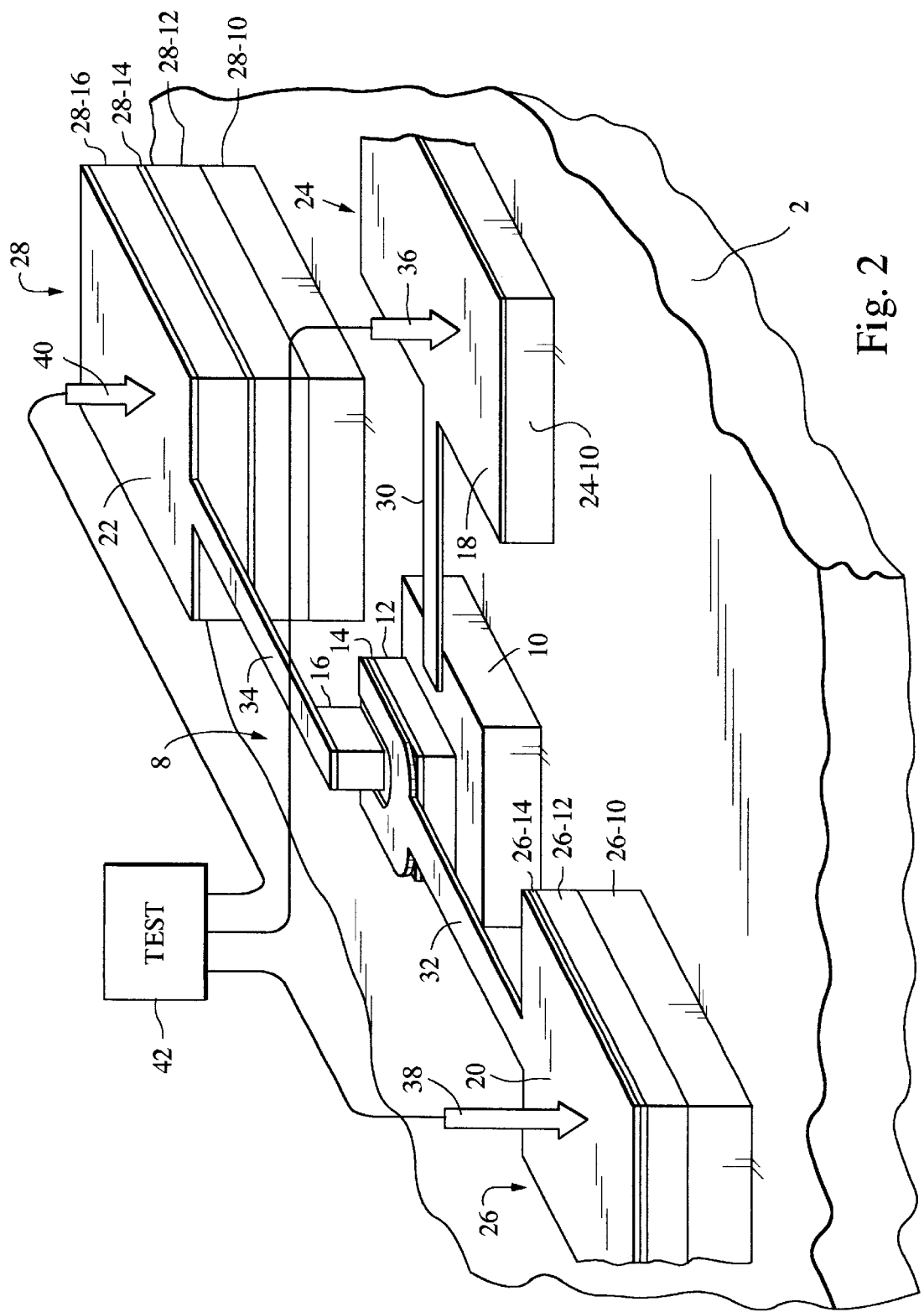
FIG. 2 is a perspective view illustrating a test transistor fabricated in accordance with the invention in the process of characterization.

One embodiment of the new test transistor structure for an HBT is illustrated in FIG. 2. The transistor itself is designated by reference number 8, with the test probe pads and associated support structure offset lateral to this device. Progressing upward from the substrate 2, the HBT is formed as a stack that comprises a highly conductive subcollector 10 which establishes an area contact with the underside of the collector 12, a thin base layer 14 surmounting the collector, and a narrower emitter structure 16 formed over the base.

Relatively large area collector, base and emitter probe contact pads 18, 20 and 22 are formed respectively on pedestals 24, 26 and 28, which in turn are supported on the substrate 2. Each of the pedestals is laterally offset from the transistor 8 in a different direction, with the collector, base and emitter probe pads 18, 20 and 22 substantially coplanar with the upper surfaces of the subcollector 10, base 14 and emitter 16, respectively; the collector probe pad is also substantially coplanar with the lower surface of the collector 12.

As described in more detail below, the transistor and pedestals are initially formed from a common stack of semiconductor layers, portions of which are etched away to form the structure illustrated in FIG. 2. Thus, the pedestal 24 for the collector pad 18 comprises an extension of the transistor subcollector layer 10, designated 24-10. Similarly, the base pedestal 26 comprises extensions of subcollector 10, collector 12 and base 14, respectively designated 26-10, 26-12 and 26-14, while the pedestal 28 for the emitter probe pad 22 comprises extensions of the same three layers as the base pedestal 26, plus an extension of the emitter layer 16; these extensions are designated 28-10, 28-12, 28-14 and 28-16, respectively.

The probe pads are electrically and mechanically connected to their respective portions of the transistor by relatively thin air bridges 30, 32 and 34 for the collector, base and emitter air bridges, respectively. The air bridges are preferably fabricated in respective simultaneous, common depositions with their respective probe pads, with the portions of the air bridges overlying their respective regions of the transistor establishing electrical contacts to those regions. The air bridges are normally formed from the same type of metal, such as aluminum or copper, as that used for the upper metallization that is fabricated if the transistors are ultimately found to meet specifications. Vertical edges of the subcollector, collector/base and emitter are stepped back from the edges of their immediately underlying layers to provide shelves for supporting the contacts from the bridges.

The probe pads 18, 20 and 22 are large enough in area to be reliably contacted by test probes, schematically represented by arrows 36, 38 and 40, preferably from an automated tester 42 in which the locations of the various probe pads have been pre-programmed. Alternately, the probes can be applied to their respective pads manually. Test signals are applied to the transistor from the tester 42, and the transistor's response monitored, via the probes.

Figure 3:
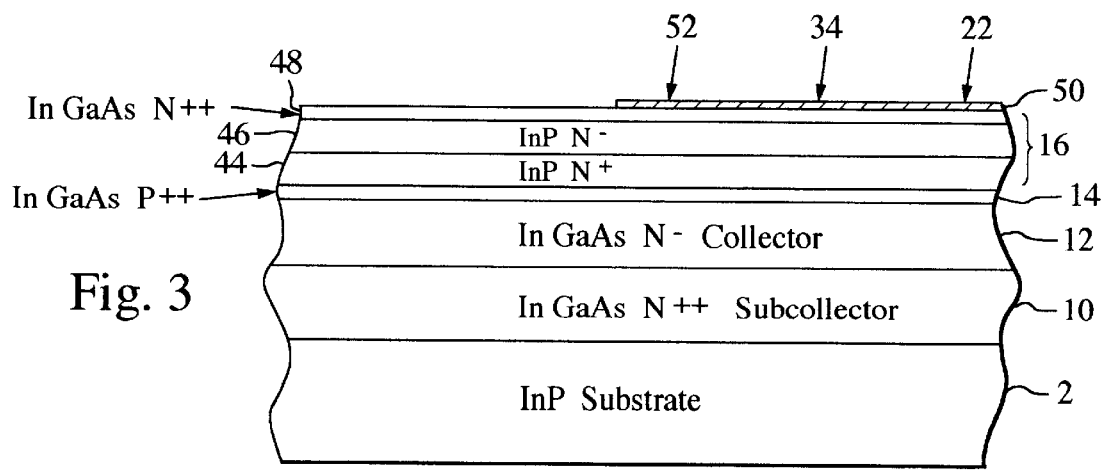
FIGS. 3–6 are sectional views illustrating sequential stages in the fabrication on one embodiment of a test transistor in accordance with the invention.

FIG. 3 is a cross-section of a wafer upon which various semiconductor layers have been deposited for transistor fabrication. In this example, an InP/InGaAs material system is used to fabricate HBTs. Other material systems and bipolar devices are also known.

The semi-insulating InP substrate 2 supports an InGaAs subcollector 10 that is heavily doped $N^{++}$ so that it is substantially conductive. The subcollector 10 is typically about 0.5–1 micron thick, with a dopant concentration of about $10^{19}/cm^3$. The purpose of the subcollector is to establish an electrical contact with the collector 12, which directly contacts the upper surface of the subcollector. The InGaAs collector 12 is typically about 0.3–0.7 microns thick, with a dopant concentration of about $10^{16}–10^{17}/cm^3$.

The base layer 14 overlying the collector layer 12 is heavily doped InGaAs, typically about 300–1000 Angstroms thick and carbon doped $P^{++}$ to a concentration about $5 \times 10^{19}/cm^3$.

The emitter structure, designated by reference number 16 in FIG. 2, actually consists of a functional emitter layer 44 on the base layer 14, surmounted by an emitter spacer layer 46 and an emitter cap layer 48. In this example the emitter layer 44 is InP typically about 400–2000 Angstroms thick and $N^+$ doped to a concentration of about $3 \times 10^{17}/cm^3$. The emitter spacer layer 46 is illustrated as an InP layer doped $N^+$ to a concentration of about $10^{16}–10^{17}/cm^3$, while the emitter cap 48 in this example is InGaAs doped $N^{++}$ to a concentration of about $10^{19}/cm^3$. The emitter spacer and cap layers are typically about 500 Angstroms and 200 Angstroms thick, respectively.

Also illustrated in FIG. 3 is an emitter contact metallization 50 which has been patterned on the upper surface of the emitter cap layer 48. In the orientation of FIG. 3, the left end 52 of the emitter metallization will provide the direct emitter contact when the transistor is fabricated, while the distal portion at the right end will function as the emitter probe contact pad 22 of FIG. 2, and the intermediate portion as the emitter air bridge 34. Although shown in section in FIG. 3, the emitter metallization would have the geometry illustrated in FIG. 2. The width of the emitter contact 52 and air bridge 34 is not greater than about 1 micron; this enables the air bridge to be established by an etch step that removes the underlying semiconductor material, as described below.

Figure 4:
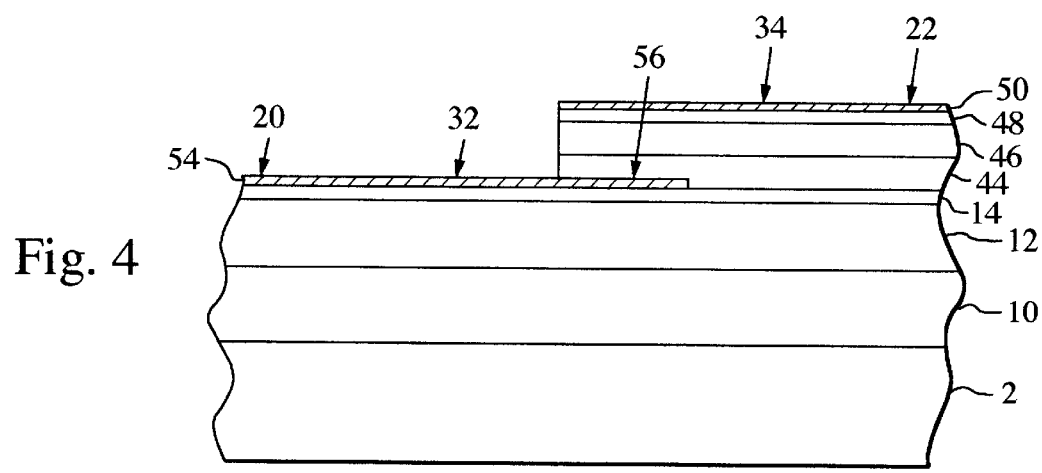
Figure 5:
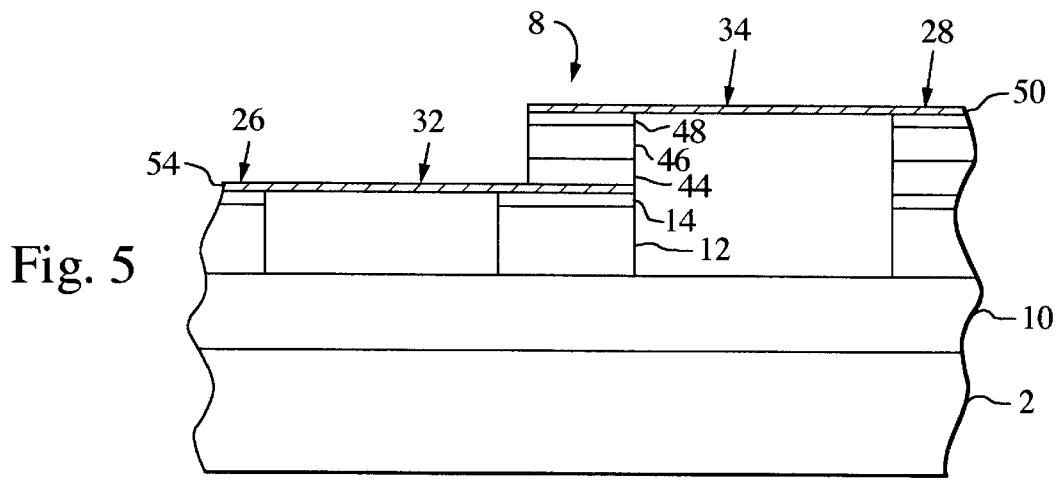
Figure 6:
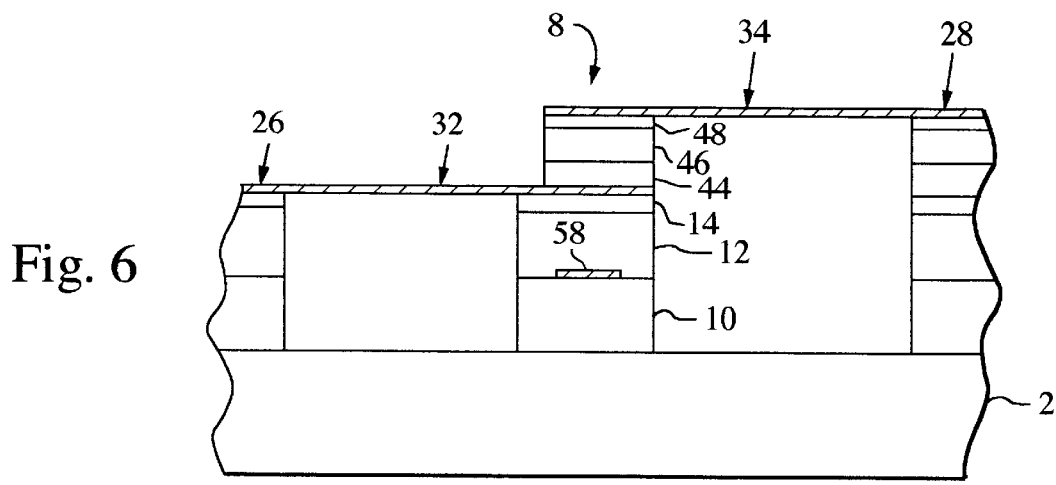

Subsequent stages of the transistor fabrication are illustrated in FIGS. 4–6. The fabrication sequence is the same for both the test and circuit transistors, except probe pads and associated air bridges are not provided for the circuit transistors. Instead, the contact metallizations patterned on the emitter, base and subcollectors of the circuit transistors do not extend beyond the limits of the transistors.

FIG. 4 illustrates the results of the next several fabrication steps. A photoresist (not shown) is laid down over the intended emitter area, and the emitter layers 44, 46 and 48 are etched away outside the photoresist down to the base layer 14. The photoresist actually extends slightly beyond the intended emitter boundaries to allow for a certain amount of undercutting during etching. The etch step is generally insufficient for the material under the emitter bridge 34 to be removed, so that bridge remains a "land bridge". After etching, a base metallization 54 is patterned over the base layer 14 to establish a base contact 56 and the base probe contact pad 20 and bridge 32. Again, these elements have the geometry as illustrated in FIG. 2.

In the next step, a photoresist is laid down over the areas intended for the transistor mesa 8 and the base and emitter probe pad pedestals 26 and 28, again extending outward slightly beyond the intended geometries to allow for undercutting, and the base and collector layers 14 and 12 are etched away from the exposed areas, leaving the structure illustrated in FIG. 5. At this stage of fabrication the base and emitter probe contact pedestals 26 and 28, and also the HBT 8, are formed down to the subcollector layer 10. This etch is deep enough for the narrow base and emitter contact bridges to be completely undercut, leaving them as air bridges between their respective probe contact pads and the transistor. Since the air bridges do not receive a vertical load, they are structurally stable.

In the next stage of fabrication, the results of which are illustrated in FIG. 6, the HBT and the base and emitter pedestals are coated with photoresist and the portion of the subcollector layer 10 surrounding them is etched away to leave the structure illustrated in FIG. 2. Prior to etching the subcollector, a collector contact metallization 58 is laid down over the subcollector layer 10 to establish a contact to the subcollector via the probe contact pad 18 and bridge 30 of FIG. 2. The subcollector material below the collector bridge 30 is removed by undercutting during the etch, leaving the bridge 30 as a true air bridge.

The probe contact pads are relatively large, typically about 50 microns per side. This establishes a capacitance between the contact pads and the substrate that, when added to the transistor's intrinsic capacitance, can significantly reduce the device's frequency range. Etching through the conductive subcollector layer breaks the connections between the extrinsic probe pad capacitances and the intrinsic transistor capacitances, preventing the extrinsic capacitances from loading down the transistor. This is particularly important in limiting the overall base-collector capacitance, which can destroy transistor performance at high frequencies.

Figure 7:
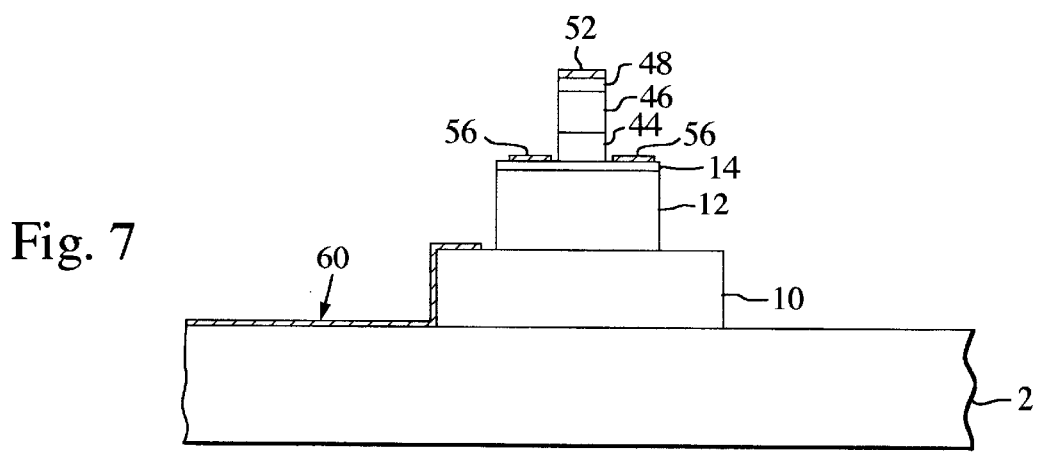
FIG. 7 is a sectional view illustrating an alternate structure for connecting the subcollector of an HBT to a test probe contact pad.

An alternate structure to the collector air bridge is illustrated in FIG. 7, which is oriented 90° to FIGS. 3–6. In this embodiment the collector air bridge is replaced with a metallization 60 that extends from the upper surface of the subcollector, down its side and onto the upper substrate surface, where it expands into a probe contact pad. Since this contact pad is directly on the surface of the substrate 2, it does not add significant capacitance.

Upon completion of the test transistors, their probe pads are open for access by test probes 36, 38 and 40, allowing the transistors to be characterized by tester 42. Since the circuit transistors are fabricated in the same process as the test devices they have essentially the same operating characteristics, and characterizing the test transistors in effect simultaneously characterizes the circuit transistors.

Figure 8:
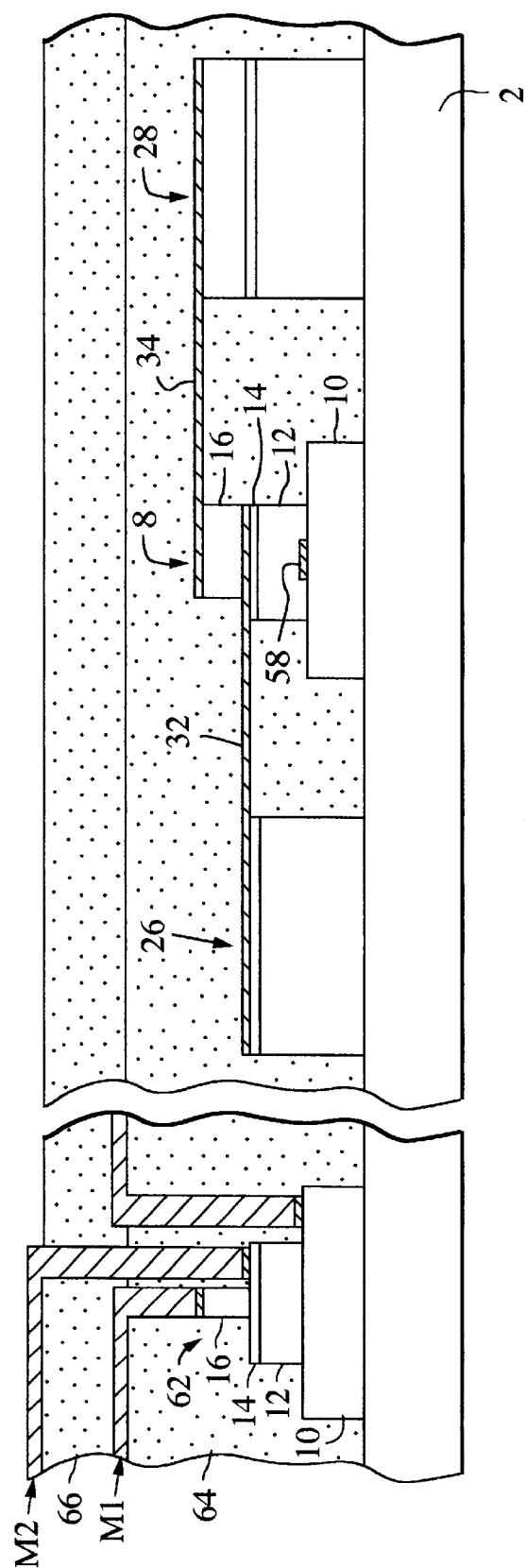
FIG. 8 is a sectional view illustrating test and circuit transistors on a completed wafer that includes an upper metallization.

If the testing reveals that the transistors do not satisfy specifications, the wafer can simply be discarded at this point. However, if the transistors are characterized as operating properly, the wafer fabrication is then completed by forming upper metallization contacts to the circuit transistors; no further fabrication is needed for the test transistors. The final product is illustrated in FIG. 8, in which the test transistor 8 is spaced along the substrate away from a circuit transistor 62 (shown turned 90° to transistor 8). The two transistors are identical, except for the manner in which they are contacted. The circuit transistor 62 does not have any associated test probe pads. Rather, it includes conventional contact pads that are restricted to the transistor itself. If the surface area on the emitter, base or subcollector is not large enough to support an adequate contact pad, the transistor geometry can be modified to provide an enlarged area, or a contact pedestal can be provided immediately adjacent to the transistor.

External connections to the circuit transistor 62 are made by upper level metallizations, commonly provided in two metallization layers M1 and M2. After completion of the test transistors, a first layer of dielectric 64 is deposited over the surface of the entire wafer. The first metallization layer M1 is then patterned on top of the dielectric layer 64, with transistor leads extending through vias in the dielectric to appropriate contact pads on the transistors in a conventional manner. An upper dielectric layer 66 is then deposited over the first dielectric layer and metallization M1, and an upper metallization M2 formed on the upper dielectric layer and connected through vias in the upper and lower dielectric layers to the circuit devices. In the illustration of FIG. 8, the M1 metallization provides contacts to the circuit transistor emitters and subcollectors, while the upper metallization M2 provides connections to the circuit transistor bases. The provision of upper and lower metallization layers enables crossovers between metallization leads, and is a conventional IC fabrication technique.

No connections between either of the metallization layers M1 or M2 need be made to the test transistors 8, since those devices completed their function with the transistor testing through the test probe pads, and have no further role to play. The provision of test transistors with substantially planar probe contact pads as described enables a more efficient overall fabrication process, since bad wafers can be identified before the dielectric layers or upper level metallization are put in place, and that portion of the ordinary fabrication can simply be dispensed with. At the same time, the test transistors are relatively few in number and do not take up a significant portion of the wafer's "real estate".

While particular embodiments of the invention have been shown and described, numerous variations and alternate embodiments will occur to those skilled in the art. For example, while described in connection with an InP/InGaAs material system, the invention is applicable to virtually all bipolar transistors with emitters, bases and collectors at different levels, and to all known material systems for such transistors. Accordingly, it is intended that the invention be limited only in terms of the appended claims.

We claim:

1. A test transistor structure, comprising:
   a bipolar transistor having emitter, base and collector regions, and
   a test probe pad for a respective one of said regions, said test probe pad located lateral to, spaced from and substantially coplanar with said region,
   said transistor comprising a heterojunction bipolar transistor (HBT) having its emitter, base and collector and a subcollector formed at different respective levels relative to a substrate.

2. The test transistor structure of claim 1, wherein said test probe pad comprises a common metallization with a contact for its respective region.

3. The test transistor structure of claim 1, wherein said test probe pad is electrically connected to its respective region by an air bridge.

4. The test transistor structure of claim 3, wherein the HBT's emitter and base are connected by respective air bridges to respective laterally located and substantially coplanar test probe pads.

5. The test transistor structure of claim 4, wherein a gap is provided in said subcollector below said air bridges.

6. The test transistor structure of claim 5, wherein the HBT's subcollector is connected to a respective laterally located and substantially coplanar test probe pad by a respective air bridge that spans said gap.

7. A test transistor structure, comprising:
   a bipolar transistor having emitter, base and collector regions, and a test probe pad for a respective one of said regions, said test probe pad located lateral to, spaced from and substantially coplanar with said region, said transistor comprising a test transistor formed on a substrate, further comprising at least one circuit transistor on said substrate with substantially the same structure as said test transistor but without lateral test probe pads.

8. The test transistor structure of claim 7, further comprising a dielectric layer overlying said test and circuit transistors, and a metallization on said dielectric layer connected to said circuit transistors but not to said test transistor through said dielectric layer.

9. A test transistor structure, comprising:

a bipolar transistor having emitter, base and collector regions, and a test probe pad connected to a respective one of said regions, said test probe pad located lateral to its respective region and comprising a common metallization with a contact for said region, said transistor comprising a heterojunction bipolar transistor (HBT) having its emitter, base and collector and a subcollector formed at different respective levels relative to a substrate.

10. The test transistor structure of claim 9, wherein said test probe pad is electrically connected to its respective region by an air bridge.

11. The test transistor structure of claim 10, wherein the HBT's emitter and base are connected by respective air bridges to respective laterally located test probe pads, said emitter and base having respective contacts that comprise common respective metallizations with their respective test probe pads and air bridges.

12. The test transistor structure of claim 11, wherein a gap is provided in said subcollector below said air bridges.

13. The test transistor structure of claim 12, wherein the HBT's subcollector is connected to a respective laterally located test probe pad by a respective air bridge that spans said gap, said subcollector having a respective contact that comprises a common metallization with its respective test probe pad and air bridge.

14. A test transistor structure, comprising:

a bipolar transistor having emitter, base and collector regions, and a test probe pad connected to a respective one of said regions, said test probe pad located lateral to its respective region and comprising a common metallization with a contact for said region, said transistor comprising a test transistor formed on a substrate, further comprising at least one circuit transistor on said substrate with substantially the same structure as said test transistor but without lateral test probe pads.

15. The test transistor structure of claim 14, further comprising a dielectric layer overlying said test and circuit transistors, and a metallization on said dielectric layer connected to said circuit transistors but not to said test transistor through said dielectric layer.

16. A test heterojunction bipolar transistor (HBT) structure, comprising:

a substrate having an edge, a subcollector layer over said substrate having an edge stepped back from the substrate edge, a collector layer over said subcollector layer and a base layer over said collector layer, said collector and base layers having respective edges stepped back from said subcollector layer edge, an emitter layer over said base layer having an edge stepped back from said base layer edge, emitter and base pedestals on said substrate laterally spaced from said emitter and base layers, respectively, emitter and base test probe pads on said emitter and base pedestals, respectively, connected by respective emitter and base air bridges to respective emitter and base contacts on said emitter and base layers, respectively, and a collector test probe pad located lateral to said subcollector layer and connected by a collector lead to a subcollector contact on said subcollector.

17. The test HBT structure of claim 16, wherein said emitter test probe pad, emitter air bridge and emitter contact, said base test probe pad, base air bridge and base contact, and said collector test probe pad, collector lead and subcollector contact comprise common respective metallizations.

18. The test HBT structure of claim 16, wherein said emitter and base test probe pads are substantially coplanar with said emitter and base contacts, respectively.

19. The test HBT structure of claim 16, wherein a gap is provided in said subcollector layer below said emitter and base air bridges.

20. The test HBT of claim 16, wherein said collector test probe pad is provided on a subcollector pedestal on said substrate laterally spaced from said subcollector layer, said collector lead comprising a collector air bridge.

21. The test HBT of claim 16, further comprising at least one circuit HBT on said substrate with substantially the same structure as said HBT but without lateral test probe pads.

22. The test HBT of claim 21, further comprising a dielectric layer overlying said test and circuit HBTs, and a metallization on said dielectric layer connected to said circuit HBTs but not to said test HBT through said dielectric layer.

* * * * *